(12) United States Patent
Dockwiller et al.

(10) Patent No.: US 10,120,036 B2
(45) Date of Patent: Nov. 6, 2018

(54) AUTONOMOUS ELECTRONIC MODULE

(71) Applicant: DIEHL METERING SAS (Societe par Actions Simplifiee), Saint Louis (FR)

(72) Inventors: Bernard Dockwiller, Saint-Bernard (FR); Guy Bach, Waldighoffen (FR)

(73) Assignee: DIEHL METERING SAS, Saint-Louis (FR)

( * ) Notice: Subject to any disclaimer, the term of this patent is extended or adjusted under 35 U.S.C. 154(b) by 0 days.

(21) Appl. No.: 15/116,584

(22) PCT Filed: Feb. 5, 2015

(86) PCT No.: PCT/FR2015/050280
§ 371 (c)(1),
(2) Date: Aug. 4, 2016

(87) PCT Pub. No.: WO2015/118270
PCT Pub. Date: Aug. 13, 2015

(65) Prior Publication Data
US 2016/0349332 A1    Dec. 1, 2016

(30) Foreign Application Priority Data
Feb. 5, 2014 (FR) .................................. 14 50870

(51) Int. Cl.
  *G01R 31/36* (2006.01)
  *G01R 19/165* (2006.01)
  (Continued)

(52) U.S. Cl.
  CPC ... *G01R 31/3689* (2013.01); *G01R 19/16542* (2013.01); *G01R 31/3672* (2013.01);
  (Continued)

(58) Field of Classification Search
  CPC .............. G01R 31/362; G01R 31/3679; G01R 31/3662; G01R 31/3606; G01R 31/3651;
  (Continued)

(56) References Cited

U.S. PATENT DOCUMENTS 4,680,527 A    7/1987   Benenati et al.
6,011,379 A *  1/2000   Singh .................. B60L 11/1881
                                               320/132

(Continued)

FOREIGN PATENT DOCUMENTS

WO          98/40925 A1      9/1998

OTHER PUBLICATIONS

International Search Report, dated May 7, 2015, from corresponding PCT application.

*Primary Examiner* — Jermele M Hollington
*Assistant Examiner* — Taqi Nasir
(74) *Attorney, Agent, or Firm* — Young & Thompson

(57) ABSTRACT

The autonomous electronic module (1) includes: —a cell (2) providing a supply current ($I_{cell}$) to the electronic module, —a resistor (2) connected in series with the cell, the resistor exhibiting terminals, —elements for measuring a voltage (20) across the terminals of the resistor and elements for evaluating the charge remaining (10, 11, 12), arranged so as to process a measurement of the voltage in order to calculate the charge remaining of the cell (2).

10 Claims, 1 Drawing Sheet

(51) Int. Cl.
*H01M 6/50* (2006.01)
*H01M 10/42* (2006.01)
*H01M 10/44* (2006.01)

(52) U.S. Cl.
CPC ..... *G01R 31/3675* (2013.01); *G01R 31/3693* (2013.01); *H01M 6/5044* (2013.01); *H01M 10/4285* (2013.01); *H01M 10/443* (2013.01)

(58) Field of Classification Search
CPC ............ G01R 31/3658; G01R 31/3624; G01R 31/3627
USPC ....... 324/425, 426, 430, 432, 433, 427, 678, 324/409, 410, 536, 76.65–76.67, 76.76

See application file for complete search history.

(56) References Cited

U.S. PATENT DOCUMENTS

| | | | |
|---|---|---|---|
| 6,154,033 A * | 11/2000 | Palanisamy | G01R 31/3627 324/425 |
| 6,215,312 B1 * | 4/2001 | Hoenig | G01R 31/2853 324/427 |
| 7,917,315 B1 | 3/2011 | Benckenstein et al. | |
| 2011/0082621 A1 * | 4/2011 | Berkobin | B60L 11/1824 701/31.4 |
| 2011/0115442 A1 * | 5/2011 | Garrastacho | G01R 31/3637 320/157 |
| 2011/0153240 A1 * | 6/2011 | Benckenstein, Jr. | G01R 31/3613 702/63 |
| 2013/0041538 A1 * | 2/2013 | Jin | B60L 11/1877 701/22 |
| 2013/0145199 A1 * | 6/2013 | Fu | G06F 1/3212 713/502 |
| 2013/0275065 A1 * | 10/2013 | Rathmann | G01R 31/362 702/61 |

* cited by examiner

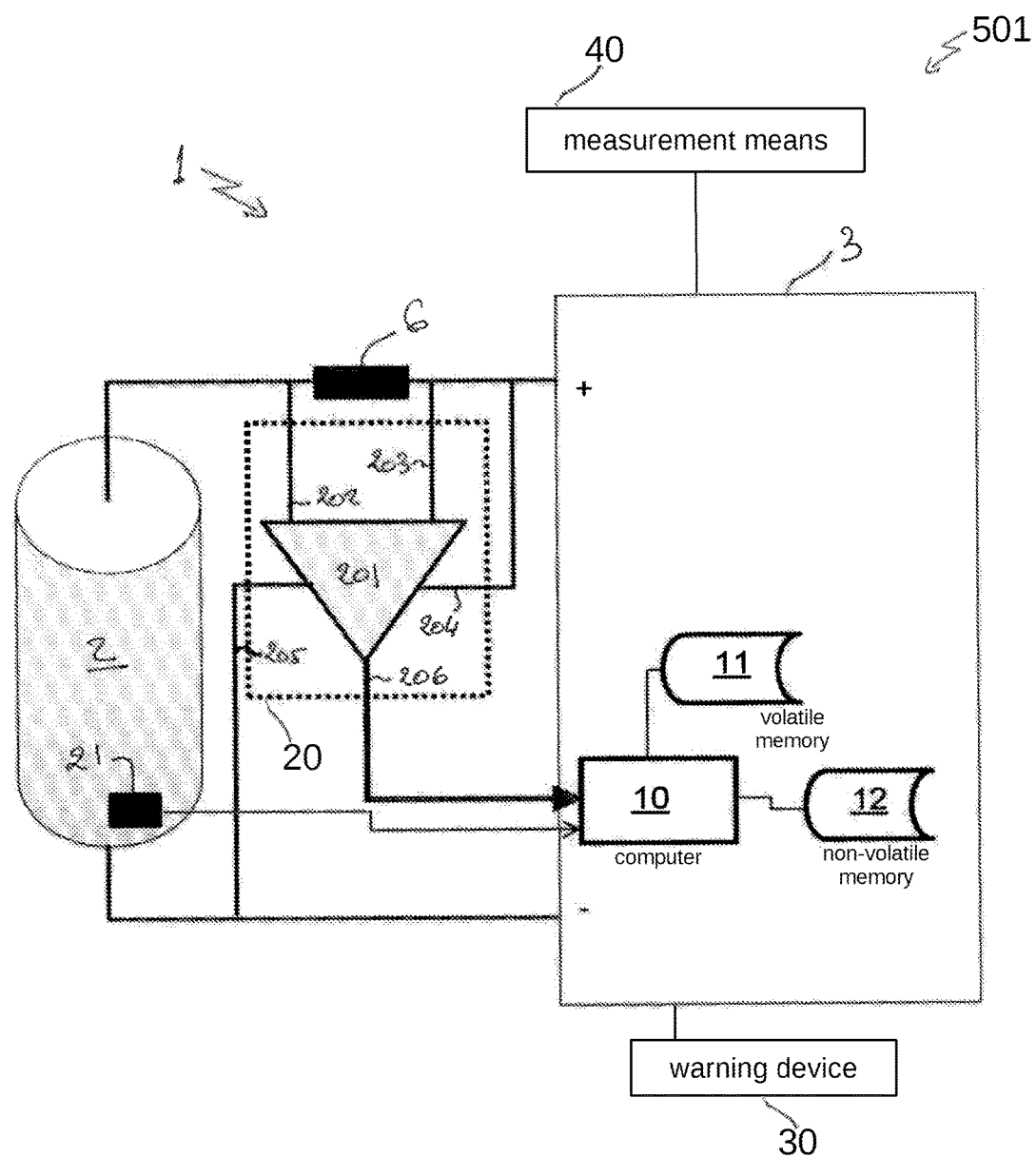

AUTONOMOUS ELECTRONIC MODULE

FIELD OF THE INVENTION

The invention concerns an autonomous electronic module.

This invention can be applied regardless of the type of autonomous electronic module. In particular, the invention can be applied especially in the field of fluid meters and thermal energy meters. The invention can also be applied especially in the field of autonomous radio communication modules.

STATE OF THE ART

So-called autonomous electronic modules are characterised by having no access to electricity via an electricity network but, instead, these modules derive their power traditionally from one or from a multiplicity of cells. In order to optimise the reliability of operation and to avoid any risk affecting the security of the installation, often the cells provided to supply power to these electronic modules are not replaceable. Against a background in which the demand relating to the service life required for these electronic modules is growing, there is a need, therefore, to estimate the operating conditions of the autonomous electronic modules as well as possible in order to provide the best possible evaluation of their supply of energy.

The service life of a cell depends substantially on its temperature and on the current it is delivering. Current techniques to estimate the operating conditions of the electronic modules consist of defining a temperature profile and an operating profile of the device in order to define the profile of the current consumed by the electronic module. Thus, it involves an estimate based on purely theoretical projections of the operation of the electronic module.

An autonomous electronic module is known in the public domain comprising:
  a cell providing a supply current to the electronic module,
  a resistor connected in series to the cell, said resistor having terminals.

It has been established that an electronic module of this type is not optimal since the operating assumptions (temperatures of the electronic module and the enclosure in which the cell operates, operating conditions of the electronic module, the ageing state of the electronic module, the ageing state of the cell) change and present differences compared with the purely theoretical projections of the operation of the electronic module. Under these conditions, the estimates based on the operating projections of the electronic module are overestimated or underestimated in relation to the actual operating conditions of the electronic module. In a first case, the service life of the cell supplying the electronic module will be reduced compared with that which has been provided for and, in a second case, the service life of the cell supplying the electronic module will be greater compared with that which has been provided for. In this instance, only the first case is problematic. In such cases, when the service life of the cell is reduced more than has been provided for, the costs of the installation are impacted negatively; losses can occur in exploitation, or in an unplanned maintenance operation or even a doubt raised about the reliability of the methods being used to exploit the resources of the installation and in which the measuring device, containing an autonomous electronic module of this type, evaluates the amount of resources being used.

SUBJECT MATTER OF THE INVENTION

Against this background, the aim of the invention is to mitigate the disadvantages of the prior art by proposing, at less cost, an improved autonomous electronic module. In particular, it involves improving the estimation of the charge remaining in the electronic module and to limit the discrepancies arising from an overestimation of the service life of the cell; one aim which this addresses is to monitor the current supplied by the electronic module. Another aim addressed is to monitor the consumption of current from the electronic module in order to detect faults. Another aim is to observe the changing pattern of the consumption of current over the long term in order to detect faults in the electronic module. Another aim is to give a warning when the current consumption fails to conform. Another aim is to save the data related to the history of the current consumption by the electronic module when the cell supplying the electronic module is no longer operating. It also involves estimating the state of the charge of the cell taking into account the temperature of the enclosure in which the cell is disposed and of the consumption of current from the cell's standpoint.

The solution proposed is that the autonomous electronic module comprises means of measuring a voltage across the terminals of the resistor and means for evaluating the charge remaining, arranged so as to process the measurement of the said voltage in order to calculate the remaining charge.

By arranging a resistor connected in series to the cell an evaluation can be made by the voltage measuring means of the difference in electrical potential between each of the terminals of the resistor. It is possible, therefore, via the means of evaluating the remaining charge, to calculate the current supplied by the cell and to use it to work out the charge remaining in the cell.

In one embodiment, the voltage measurement means at the terminals of the resistor comprise a differential amplifier.

By measuring the analogue voltage at the terminals of the resistor, this differential amplifier provides a means of deriving an analogue voltage proportional to the current passing through the resistor wherein this latter voltage is referenced with respect to zero by the computer. The differential amplifier is a component offering a reduction in cost and ease of incorporation in an autonomous electronic module of this type.

In another embodiment, the means for evaluating the remaining charge are incorporated in a computer, the computer being arranged such that it processes the voltage representing the current supplying the cell, with a non-volatile memory comprising predetermined value thresholds being linked to the computer, the computer being connected to a first warning device, arranged to receive a first operating signal when the voltage representing the supplying current does not fall between the first predetermined value thresholds.

Based on the analogue voltage displayed when input into the evaluation means by the voltage measurement means, this arrangement allows a comparison to be made between the signal representing the supply current and the first predetermined value thresholds, enabling any abnormality in the supply current provided by the cell to be detected, which could then be flagged by the first warning device.

In one embodiment:
  the non-volatile memory comprises predetermined value profiles, the computer is connected to a non-volatile memory comprising all of the data relating to the measurement of the supply current as a function of time.

This connection allows a comparison to be made between the consumption history of the autonomous electronic module and the predetermined value profiles in order to detect any abnormality in the operation of the autonomous electronic module.

In another embodiment, the computer is connected to a second warning device arranged to receive a second operating signal when all of the data relating to the measurement of the supply current as a function of time does not fall between the predetermined value profiles.

In one embodiment, the autonomous electronic module comprises a temperature sensor arranged to provide a measurement of the temperature of the cell and wherein the computer is arranged to calculate the charge remaining in the cell from the measurement of the voltage across the terminals of the resistor and from the measurement of the temperature of the cell.

This disposition makes it possible, in particular, to link the measurement of the voltage across the terminals of the resistor (from which the supply current provided by the cell is derived) with the measurement of the temperature of the cell. Thus, this disposition allows the conditions to be taken into account under which the autonomous electronic module operates. This being the case, it can be seen, therefore, that an electronic module fitted with this type of sensor enables the error to be corrected and to provide a more reliable estimate of the charge remaining in the cell regardless of the temperature of the cell.

In one embodiment, the autonomous electronic module comprises a non-volatile memory comprising all of the data relating to the measurement of the temperature as a function of time.

When the cell is at the end of its service life, it is then possible to know the way the temperature changes as a function of time and its impact on the supply current actually consumed which has been supplied by the cell.

With regard to a second aim, a meter is also envisaged to evaluate the consumption of fluid or thermal energy by an installation comprising:
- an autonomous electronic module according to one of the embodiments described above,
- measurement means connected to the autonomous electronic module and arranged to measure a flow of fluid or of thermal energy in the installation.

The electronic module can be used particularly as a meter for water, gas or thermal energy.

In one embodiment, a common computer comprises means of evaluating the remaining charge and means of evaluating the consumption of fluid or thermal energy by the installation.

By integrating the means of evaluating the remaining charge and means of evaluating the consumption of fluid, a computer can be provided comprising two functions in the same component. This integration enables the cost of manufacturing the meter to be reduced and to reduce the number of parts and the congestion of the components forming the meter.

Other features and advantages of the invention will appear from the description below of one embodiment of the invention. With regard to the attached drawings:

FIG. 1 shows a diagrammatic view of one embodiment of the invention.

DESCRIPTION OF EMBODIMENT EXAMPLES OF THE INVENTION

This concerns an autonomous electronic module 1, such as a meter for evaluating the consumption of fluid or thermal energy of an installation, said module comprising a cell 2 providing a supply current $I_{cell}$ to an electronic circuit 3 of the autonomous electronic module 1, a resistor 6 connected in series to the cell 2, said resistor 6 exhibiting terminals, means of measuring 20 a voltage across the terminals of the resistor and means for evaluating 10,11,12 the charge remaining, arranged so as to process the measurement of said voltage to calculate the charge remaining.

The means of measuring 20 the voltage across the terminals of the resistor 6 is arranged so as to communicate a voltage relating to a measurement of the supply current $I_{cell}$ provided by the cell 2, the resistor 6 being connected between the supply of the autonomous electronic module and the cell.

The means of evaluating the remaining charge 10, 11, 12 of the cell process the data relating to the measurement of the supply current $I_{cell}$ provided by the cell 2, that is, the voltage across the terminals of the resistor 6, to derive from this the remaining charge in the cell. The means of evaluating the remaining charge 10, 11, 12 comprise a computer 10. This computer 10 is arranged to process the voltage representing the supply current $I_{cell}$ provided by the cell. A volatile memory 11 is linked to the computer 10. This volatile memory 11 is a memory in which the data provided by the voltage measurement means 20 across the terminals of the resistor 6 are located so that they can be processed rapidly by the computer 10. These data are lost as soon as the cell 2 is no longer in an operating state. In one embodiment, the means of evaluating the remaining charge comprise a non-volatile memory 12 in order to record the developing pattern of the consumption of current during the time in which the autonomous electronic module 1 is operating and therefore to retain the data relating to the history of the consumption of current by the autonomous electronic module 1 when the cell 2 supplying the autonomous electronic module 1 is no longer in an operating state.

More particularly, the computer 10 is arranged to process the voltage representing the supply current $I_{cell}$ provided by the cell 2 from the data relating to the measurement of the supply current $I_{cell}$ derived from the measurement of the voltage across the terminals of the resistor 6. In one embodiment, the computer 10 is connected to a first warning device 30 arranged to receive a first operating signal of the computer 10 when the signal representing the supply current $I_{cell}$ does not fall between the predetermined value thresholds contained in the volatile memory 11 or in the non-volatile memory 12.

In another embodiment, the volatile memory 11 or the non-volatile memory 12 comprises predetermined value profiles. In this case, the computer 10 performs a comparison between all of the data relating to the measurement of the supply current $I_{cell}$ as a function of time and the predetermined value profiles stored in one of the volatile 11 and non volatile memories 12. The computer 10 can be connected to a second warning device 30 arranged to receive a second operating signal of the computer 10 when all of the data relating to the measurement of the supply current $I_{cell}$ as a function of time does not fall between the predetermined value profiles. The first warning device 30 and the second warning device 30 can be defined by a single warning device 30. The first and second warning devices 30 comprise, for example, means of communication by radio frequency.

The resistor 6 is a resistor with a low value. It represents a first terminal connected to the cell and a second terminal connected to the supply, i.e. the terminal +, of the electronic circuit 3 of the autonomous electronic module 1. The first and second terminals represent respectively a first electrical potential 202 and a second electrical potential 203. A differential amplifier 201, is arranged to calculate a difference in electrical potential, the differential amplifier being connected in parallel to the first and second terminals of the said resistor 2. At its outlet 206, the differential amplifier 201 supplies a voltage value measured, therefore, by computer 10. The differential amplifier is itself supplied at 204, 205 by cell 2 in parallel to the electronic circuit 3 of the autonomous electronic module 1.

In an alternative version, the autonomous electronic module 1 comprises a temperature sensor 21 arranged to provide a measurement $T_{cell}$ of the temperature of the cell 2. The computer 10 is thus arranged to calculate the remaining charge from the signal representing the supply current $I_{cell}$ and from the measurement of the temperature $T_{cell}$ of the cell 2.

The temperature sensor 21 thus enables the temperature $T_{cell}$ associated with the cell 2 to be acquired. Alternatively, the temperature sensor 21 comprises a sensing element connected to the enclosure into which the cell is inserted. The temperature $T_{cell}$ of the cell is therefore an ambient temperature of the enclosure into which the cell is inserted.

Thus the computer 10 is arranged to calculate the remaining charge from the signal representing the supply current $I_{cell}$ and from the measurement of the temperature $T_{cell}$ of the cell 2. However, the non-volatile memory 12 may also comprise all of the data relating to the measurement of the temperature $T_{cell}$ of the cell 2 as a function of time, as well as all of the data relating to the measurement of the supply current $I_{cell}$ as a function of time. Thus, the non-volatile memory 12 is useful in that it makes it possible to know, for example, the number of hours of operation during which the autonomous electronic module 1 has consumed a large amount of current and how many times the cell 2 has overheated, etc . . . .

Pursuant to another aim of the invention, a meter 501 is envisaged to evaluate the consumption of fluid or thermal energy of an installation, where the meter comprises the autonomous electronic module 1 as defined above, as well as measurement means 40 connected to the autonomous electronic module 1 and arranged to measure fluid flow or thermal energy flow at the installation. The computer 10 can be common in order, on the one hand, to calculate the remaining charge, and, on the other hand, to evaluate the consumption of fluid or thermal energy by the installation. The meter is a water, gas or thermal energy meter.

It goes without saying that it is possible to make numerous modifications to the invention without departing from its scope.

The invention claimed is:

1. A meter (501) that evaluates a consumption of fluid or thermal energy of an installation, the meter comprising:
   an autonomous electronic module (1), that includes
      an electronic circuit (3),
      a cell (2) providing a supply current ($I_{cell}$) to the electronic circuit (3),
      a resistor (6) connected in series to the cell (2), said resistor (6) including terminals for connection thereto,
      voltage measuring means (20) that measures a voltage across the terminals of the resistor (6) as an indication of the supply current ($I_{cell}$),
      a temperature sensor (21) that provides a measurement of the temperature ($T_{cell}$) of the cell (2), and
      means of evaluating a remaining charge (10, 11, 12), configured to process the supply current ($I_{cell}$) and the measured the temperature ($T_{cell}$) of the cell (2) to calculate the remaining charge of the cell (2),
      the means of evaluating the remaining charge being part of the electronic circuit (3), and including a computer (10) with at least one memory (11,12) connected thereto, the at least one memory (11,12) having stored therein predetermined value thresholds or predetermined value profiles;
   and means of measurement (40) connected to the autonomous electronic module that measures a flow of fluid or thermal energy provided at the installation,
   wherein said computer (10) is configured to evaluate the consumption of the fluid or thermal energy of the installation, and
   wherein said computer (10) is connected to a warning device (30) that receives an operating signal from the computer when all data relating to the measurement of the supply current ($I_{cell}$) as a function of time does not fall between the predetermined value profiles and/or when the measurement of the supply current falls outside one of said predetermined value thresholds or predetermined value profiles stored in said at least one memory (11, 12).

2. The meter according to claim 1, wherein the voltage measurement means (20) comprise a differential amplifier (201).

3. The meter according to claim 1, wherein the at least one memory comprises a non-volatile memory (12), and said computer records in the non-volatile memory all the data relating to the measurement of the supply current ($I_{cell}$) as a function of time.

4. The meter according to claim 1, wherein the computer uses the supply current ($I_{cell}$) obtained by measuring the voltage across the terminals of the resistor and from the measurement ($T_{cell}$) of the temperature of the cell to calculate the remaining charge.

5. The meter according to claim 4, wherein the at least one memory comprises a non-volatile memory (12), and said computer records in the non-volatile memory all data relating to the measurement of the temperature ($T_{cell}$) as a function of time.

6. The meter according to claim 2, wherein the at least one memory comprises a non-volatile memory (12), and said computer records in the non-volatile memory all the data relating to the measurement of the supply current ($I_{cell}$) as a function of time.

7. The meter according to claim 2, wherein the computer uses the supply current ($I_{cell}$) obtained by measuring the voltage across the terminals of the resistor and from the measurement ($T_{cell}$) of the temperature of the cell to calculate the remaining charge.

8. The meter according to claim 3, wherein the computer uses the supply current ($I_{cell}$) obtained by measuring the voltage across the terminals of the resistor and from the measurement ($T_{cell}$) of the temperature of the cell to calculate the remaining charge.

9. The meter according to claim 7, wherein the at least one memory comprises a non-volatile memory (12), and said computer records in the non-volatile memory all data relating to the measurement of the temperature ($T_{cell}$) as a function of time.

10. The meter according to claim 8, wherein the at least one memory comprises a non-volatile memory (12), and said computer records in the non-volatile memory all data relating to the measurement of the temperature ($T_{cell}$) as a function of time.

* * * * *